(12) United States Patent
Anderson et al.

(10) Patent No.: US 11,024,546 B2
(45) Date of Patent: Jun. 1, 2021

(54) VERTICAL FIELD EFFECT TRANSISTORS

(71) Applicant: INTERNATIONAL BUSINESS MACHINES CORPORATION, Armonk, NY (US)

(72) Inventors: Brent A. Anderson, Jericho, VT (US); Edward J. Nowak, Essex Junction, VT (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/679,818

(22) Filed: Nov. 11, 2019

(65) Prior Publication Data
US 2020/0075425 A1    Mar. 5, 2020

Related U.S. Application Data

(63) Continuation of application No. 15/452,818, filed on Mar. 8, 2017, now Pat. No. 10,529,627, which is a
(Continued)

(51) Int. Cl.
| | |
|---|---|
| *H01L 21/8234* | (2006.01) |
| *H01L 29/78* | (2006.01) |
| *H01L 29/66* | (2006.01) |
| *H01L 21/764* | (2006.01) |
| *H01L 27/088* | (2006.01) |

(Continued)

(52) U.S. Cl.
CPC .......... *H01L 21/823487* (2013.01); *H01L 21/28518* (2013.01); *H01L 21/764* (2013.01); *H01L 21/823418* (2013.01); *H01L 21/823425* (2013.01); *H01L 21/823437* (2013.01); *H01L 21/823475* (2013.01); *H01L 21/823481* (2013.01); *H01L 27/088* (2013.01); *H01L 29/0653* (2013.01); *H01L 29/4238* (2013.01); *H01L 29/42392* (2013.01); *H01L 29/665* (2013.01); *H01L 29/66666* (2013.01); *H01L 29/7827* (2013.01); *H01L 29/78618* (2013.01); *H01L 29/78642* (2013.01); *H01L 29/78696* (2013.01)

(58) Field of Classification Search
CPC ............ H01L 29/0653; H01L 29/4238; H01L 29/42392; H01L 29/665
See application file for complete search history.

(56) References Cited

U.S. PATENT DOCUMENTS

| | | |
|---|---|---|
| 6,033,957 A | 3/2000 | Burns, Jr. et al. |
| 6,294,418 B1 | 9/2001 | Noble |
| (Continued) | | |

OTHER PUBLICATIONS

Office Action dated Feb. 19, 2020 in U.S. Appl. No. 16/409,147, 10 pages.
(Continued)

*Primary Examiner* — Marc Anthony Armand
(74) *Attorney, Agent, or Firm* — Steven Meyers; Andrew D. Wright; Roberts Calderon Safran & Cole P.C.

(57) ABSTRACT

Vertical field effect transistors (FETs) with minimum pitch and methods of manufacture are disclosed. The structure includes at least one vertical fin structure and gate material contacting with the at least one vertical fin structure. The structure further includes metal material in electrical contact with the ends of the at least one vertical fin.

10 Claims, 7 Drawing Sheets

Related U.S. Application Data continuation of application No. 14/965,985, filed on Dec. 11, 2015, now Pat. No. 9,653,360, which is a continuation of application No. 14/560,672, filed on Dec. 4, 2014, now Pat. No. 9,299,835.

(51) Int. Cl.
*H01L 29/06* (2006.01)
*H01L 29/423* (2006.01)
*H01L 29/786* (2006.01)
*H01L 21/285* (2006.01)

(56) References Cited

U.S. PATENT DOCUMENTS

| | | | |
|---|---|---|---|
| 6,580,124 B1 | 6/2003 | Cleeves et al. | |
| 7,339,241 B2 * | 3/2008 | Orlowski | H01L 29/41733 257/401 |
| 7,683,428 B2 | 3/2010 | Chidanbarrao et al. | |
| 7,838,948 B2 | 11/2010 | Gossner | |
| 8,183,627 B2 * | 5/2012 | Currie | H01L 29/785 257/329 |
| 8,274,110 B2 | 9/2012 | Sandhu et al. | |
| 8,378,417 B2 | 2/2013 | Ogawa et al. | |
| 8,497,548 B2 | 7/2013 | Masuoka et al. | |
| 8,637,930 B2 | 1/2014 | Ando et al. | |
| 8,716,091 B2 | 5/2014 | Cohen et al. | |
| 9,076,662 B2 | 7/2015 | El-Kareh et al. | |
| 9,087,897 B1 | 7/2015 | Anderson et al. | |
| 9,093,556 B2 | 7/2015 | Liu et al. | |
| 9,299,835 B1 | 3/2016 | Anderson et al. | |
| 9,570,357 B2 | 2/2017 | Anderson et al. | |
| 9,653,360 B2 | 5/2017 | Anderson et al. | |
| 9,653,461 B2 * | 5/2017 | Huang | H01L 21/76897 |
| 10,043,715 B2 | 8/2018 | Anderson et al. | |
| 10,256,156 B2 | 4/2019 | Anderson et al. | |
| 10,332,801 B2 | 6/2019 | Anderson et al. | |
| 10,529,627 B2 * | 1/2020 | Anderson | H01L 29/0653 |
| 2008/0179635 A1 | 7/2008 | Gossner | |
| 2014/0054706 A1 | 2/2014 | Liu et al. | |
| 2014/0117455 A1 | 5/2014 | Liu et al. | |
| 2014/0264491 A1 | 9/2014 | Huang et al. | |
| 2015/0097220 A1 | 4/2015 | Ponoth et al. | |
| 2015/0364546 A1 | 12/2015 | Rodder et al. | |
| 2016/0111339 A1 | 4/2016 | Zang | |
| 2016/0163602 A1 | 6/2016 | Anderson et al. | |
| 2016/0163811 A1 | 6/2016 | Anderson et al. | |
| 2016/0293428 A1 | 10/2016 | Fogel et al. | |
| 2017/0040222 A1 | 2/2017 | Anderson et al. | |
| 2017/0179302 A1 | 6/2017 | Anderson et al. | |
| 2019/0267291 A1 | 8/2019 | Anderson et al. | |

OTHER PUBLICATIONS

List of IBM Patents or Patent Applications Treated as Related dated Nov. 11, 2019, 1 page.

Specification "Vertical Field Effect Transistors" and Drawings in U.S. Appl. No. 16/679,506, filed Nov. 11, 2019, 26 pages.

Notice of Allowance dated Nov. 2, 2020 in U.S. Appl. No. 16/679,506, 10 pages.

Notice of Allowance dated Jun. 4, 2020 in U.S. Appl. No. 16/409,147, 9 pages.

Notice of Allowance dated Jul. 10, 2020 in U.S. Appl. No. 16/679,506, 9 pages.

Notice of Allowance dated Sep. 16, 2020 in U.S. Appl. No. 16/409,147, 9 pages.

* cited by examiner (Cross-section)

(Top-down)

(Cross-section)

(Top-down)

(Cross-section)

(Top-down)

VERTICAL FIELD EFFECT TRANSISTORS

FIELD OF THE INVENTION

The invention relates to semiconductor structures and, more particularly, to vertical field effect transistors (FETs) with minimum pitch and methods of manufacture.

BACKGROUND

A vertical field-effect transistor (FET) has a channel perpendicular to the substrate surface, as opposed to being situated along the plane of the surface of the substrate. By using this design, it is possible to increase packing density. That is, by having the channel perpendicular to the substrate surface, vertical FETs improve the scaling limit beyond planar finFETs.

However, vertical FETs are still severely challenged past the 7 nm node due to high aspect ratios, Vmax limits, and material thickness not scaling well. For example, insulator material and shared contacts formed between gate material of adjacent vertical FETs make it very difficult to scale the devices beyond the 7 nm node, basically due to material thicknesses, leakage concerns, breakdown voltage, decreased resistances and capacitance, etc. Accordingly, these constraints make it very difficult to decrease gate pitch in current vertical FET designs.

SUMMARY

In an aspect of the invention, a structure comprises at least one vertical fin structure and gate material contacting with the at least one vertical fin structure. The structure further comprising metal material in electrical contact with the ends of the at least one vertical fin.

In an aspect of the invention, a structure comprises: at least two adjacent fin structures of semiconductor material with a source region and a drain region at opposing ends; gate material about the two adjacent fin structures and between the opposing ends; a space between the gate material of the two adjacent fin structures; and drain contacts and source contacts at the opposing ends of the two adjacent fin structures on the source region and the drain region.

In an aspect of the invention, a method comprises: forming at least one vertical fin structure; forming gate material contacting with the at least one vertical fin structure; and forming source and drain contacts at ends of the at least one vertical fin structure by deposition of metal material in electrical contact with the silicide regions.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
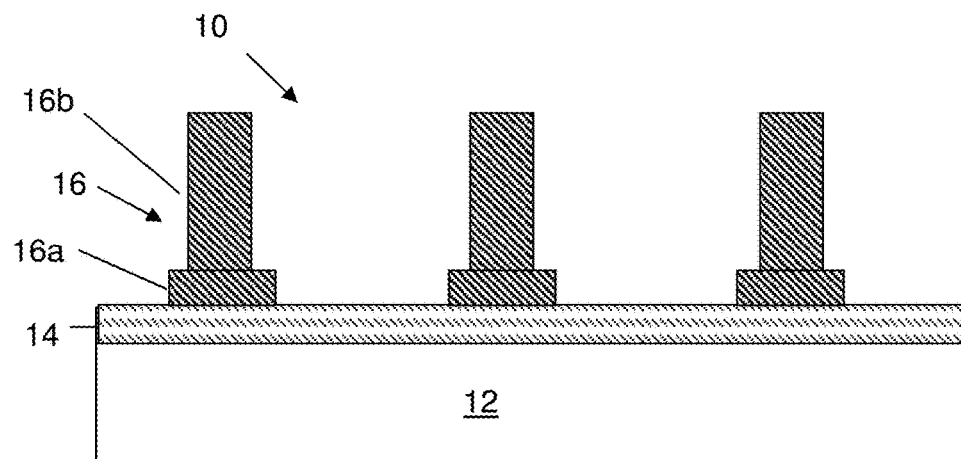
FIG. 1 shows a respective structure and fabrication processes of forming fins according to aspects of the invention.

The invention relates to semiconductor structures and, more particularly, to vertical field effect transistors (FETs) with minimum pitch and methods of manufacture. More specifically, the vertical FETs of the present invention have the source/drain contacts formed at ends of the gate structures (compared to between the gate structures) in order to reduce the pitch between adjacent gate structures, e.g., vertical FETs. Advantageously, by moving the source/drain contact to the outside ends of the FETs, the pitch of the FETs can be scaled significantly. Also, gate to contact capacitance is significantly reduced by moving the source/drain contacts to the outside ends of the FETs.

Vertical FETs significantly improve the scaling limit beyond planar finFETs; however, conventional vertical FETs are still severely challenged past the approximately 7 nm node due to high aspect ratios, Vmax limits, and material thickness not scaling well. For example, in current layouts the source and drain contact(s) are placed between adjacent FETs due to resistance issues. The challenge is that as the pitch is scaled the width (thickness) of the contact decreases. This results in a high overall contact resistance. This also results in very high contact to gate capacitance and lack of pitch scaling. That is, the placement of the contact between the gate structures effectively limits the scaling properties between adjacent vertical FETs, limiting the pitch to about 27 nm.

In comparison, the vertical FETs of the present invention have contacts at the ends of the gate structures. By placing a shared contact (or source/drain contacts) at ends of the FET and making the FET conductor bottoms tall, the resistance issues are reduced while providing lower contact to gate capacitance and, importantly, the ability to scale the gate pitch, e.g., space between adjacent FETs. Effectively, eliminating the contact between the metal gate structures of the vertical FETs also eliminates a layer of insulator material, thereby making it possible to significantly decrease the pitch (spacing) between adjacent vertical FETs. In fact, the scaling can be improved by approximately 20% or greater (e.g., approximately 29% in some instances) compared to conventional structures which place source and drain contact(s) between adjacent FETs. Moreover, by removing the shared contact between the metal gate structures, it is also possible to provide an air gap between the adjacent FETs effectively reducing capacitance.

In embodiments, the vertical FETs can be single or double sided gates. In addition, the vertical gate structures can be long without increasing pitch, and gate width, fin thickness and insulator materials can all be scaled accordingly. In this way, it is possible to minimize or scale the pitch between adjacent vertical FETs, by forming the contacts at their ends. In further embodiments, the vertical FETs comprise a first vertical double gate CMOS FET pair having a shared contact strap at one or both ends (source and drain regions) of the FINFET between the adjacent pair of FETs and a shared or individual S/D silicide region (silicide at shared S/D region). An air-gap can be formed between the adjacent vertical FETs, with a high aspect ratio bottom contact region for low horizontal resistance.

The vertical FETs of the present invention can be manufactured in a number of ways using a number of different tools. In general, though, the methodologies and tools are used to form structures with dimensions in the micrometer and nanometer scale. The methodologies, i.e., technologies, employed to manufacture the vertical FETs have been adopted from integrated circuit (IC) technology. For example, the vertical FETs are built on wafers and are realized in films of material patterned by photolithographic processes on the top of a wafer. In particular, the fabrication of the vertical FETs uses three basic building blocks: (i) deposition of thin films of material on a substrate, (ii) applying a patterned mask on top of the films by photolithographic imaging, and (iii) etching the films selectively to the mask.

FIG. 1 shows a beginning structure and respective processing steps in accordance with aspects of the present invention. The structure 10 includes a substrate 12 and an insulator layer 14 formed thereon. In embodiments, fins 16 are formed on the insulator layer 14 using conventional lithography and etching steps. In embodiments, the insulator layer 14 can be a buried oxide layer (BOX) and the fins 16 can be formed from silicon on insulator material (e.g., SOI) or any semiconductor material including, but not limited to, Si, SiGe, SiGeC, SiC, GE alloys, GaAs, InAs, InP, and other III/V or II/VI compound semiconductors.

In embodiments, the fins 16 are formed by two etching processes. For example, the first etching process forms the lower portion 16a of the fins 16, which is wider than the narrower portion (body) 16b of the fins 16; whereas, the second etching process forms the narrower portion (body) 16b of the fin 16. In any of the embodiments described herein, the bottom region, e.g., wide portion 16a of the fin 16 can be made significantly taller, e.g., 30 nm, than conventional structures thereby further reducing resistance.

By way of example of forming the fins 16, the first etching process can be a sidewall image transfer (SIT) technique. In the SIT technique, a mandrel material, e.g., oxide or nitride material, is formed on the semiconductor material using conventional deposition, lithography and etching processes. In an example of a SIT technique, the mandrel material can be deposited using conventional CVD processes. A resist is formed on the mandrel material, and exposed to light to form a pattern (openings). A reactive ion etching (RIE) is performed through the openings to form the mandrels. Spacers are formed on the sidewalls of the mandrels which are preferably material that is different than the mandrels, and which are formed using conventional deposition processes known to those of skill in the art. The spacers can have a width which matches the dimensions of the lower portion 16a of the fins 16, for example, e.g., about 7 nm. The mandrels are removed or stripped using a conventional etching process, selective to the mandrel material. An etching is then performed within the spacing of the spacers to form the sub-lithographic features. The sidewall spacers can then be stripped. In embodiments, the narrower fin portions (e.g., body) 16b of the fins 16 can be formed after the patterning process of the wider portion 16a, using conventional patterning processes as contemplated by the present invention. In embodiments, the narrower fin portions 16b can be approximately 5 nm or less.

Figure 2:
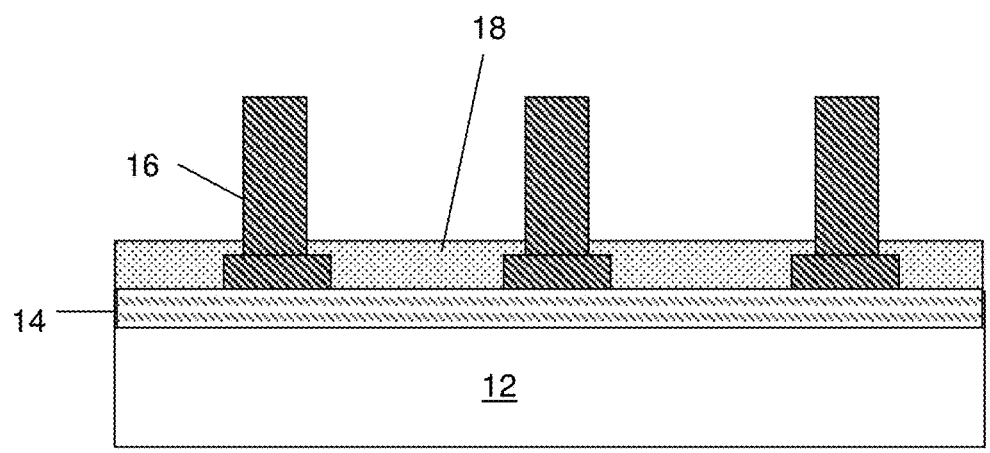
FIG. 2 shows a structure and respective fabrication processes of forming dielectric material between fins according to aspects of the invention.

As shown in FIG. 2, a dielectric material 18 is deposited on the fins 16, and etched back to expose the vertical portions of the fins 16, e.g., the narrower fin portions (e.g., body) 16b of the fins 16. In embodiments, the dielectric material 18 will protect the lower portion 16a of the fins 16 during subsequent gate formation and will ensure that a later formed source or drain portion formed at this wider portion of the fin will not short to a gate structure. The dielectric material 18 can be an oxide material, which can be blanket deposited over the fins 16 and on any exposed surfaces of the structure by using a conventional deposition process. For example, the deposition process can be a chemical vapor deposition (CVD) process.

Figure 3:
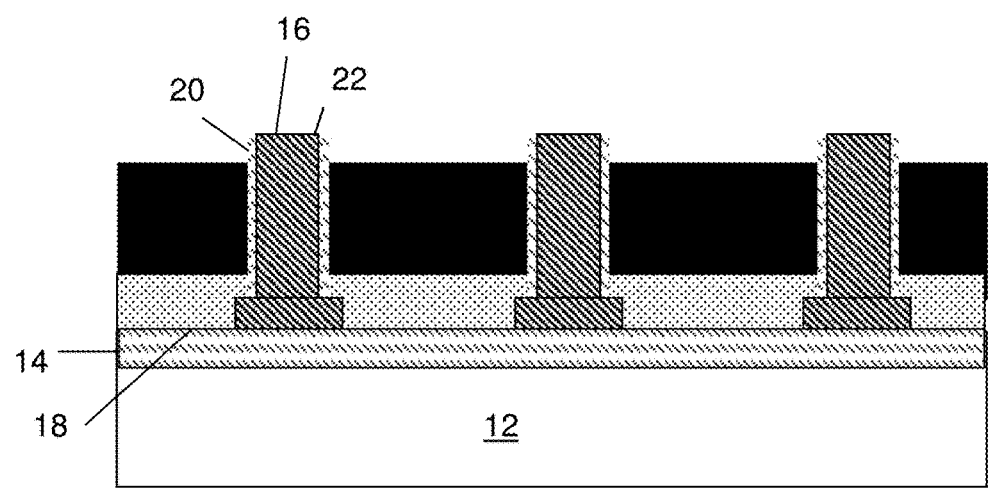
FIG. 3 shows a structure and respective fabrication processes of forming gate material around the fins according to aspects of the invention.

In FIG. 3, a gate dielectric material 20 and a gate material 22 are formed over the fins 16, e.g., the narrower fin portions (e.g., body) 16b of the fins 16, and on the etched back dielectric material 18. In embodiments, the gate dielectric material 20 can be a high-k material such as a hafnium based material, e.g., hafnium oxide. The gate material 22 can be any appropriate metal material or combinations of metal materials, depending on the desired workfunction properties. In embodiments, the gate dielectric material 20 and the gate material 22 have a thickness of about 5 nm or less, and wrap around the entire exposed vertical surfaces of the fins 16 (e.g., narrow portion 16b), on top of the dielectric material 18. The gate dielectric material 20 and the gate material 22 can be formed by a conventional deposition process, e.g., CVD, followed by a recessing process such that the vertical extents of the narrower fin portions (e.g., body) 16b of the fins 16 are exposed. In embodiments, the recess process can be a chemical mechanical process (CMP), which exposes a top surface of the fin 16 following by an etch back process.

Figure 4:
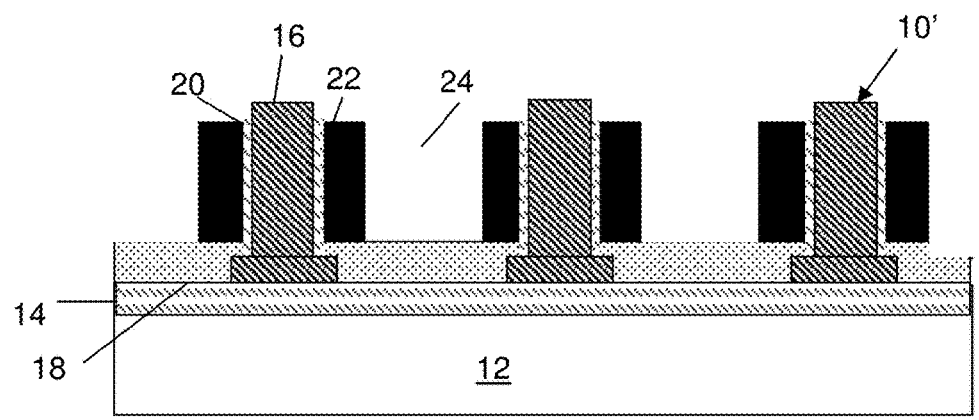
FIG. 4 shows a structure and respective fabrication processes of patterning the gate material according to aspects of the invention.

In FIG. 4, the gate dielectric material 20 and the gate material 22 are etched back, forming a space 24 between adjacent gate structures 10'. In embodiments, the space 24 between the gate dielectric material 20 and the gate material 22 can be formed by conventional lithography and etching processes, e.g., reactive ion etching (RIE) processes. The space 24 can be about 6 nm or less and is capable of being further scaled. In embodiments, the recessing of the gate dielectric material 20 and the gate material 22 can also be performed prior to or after space formation.

Figure 5:
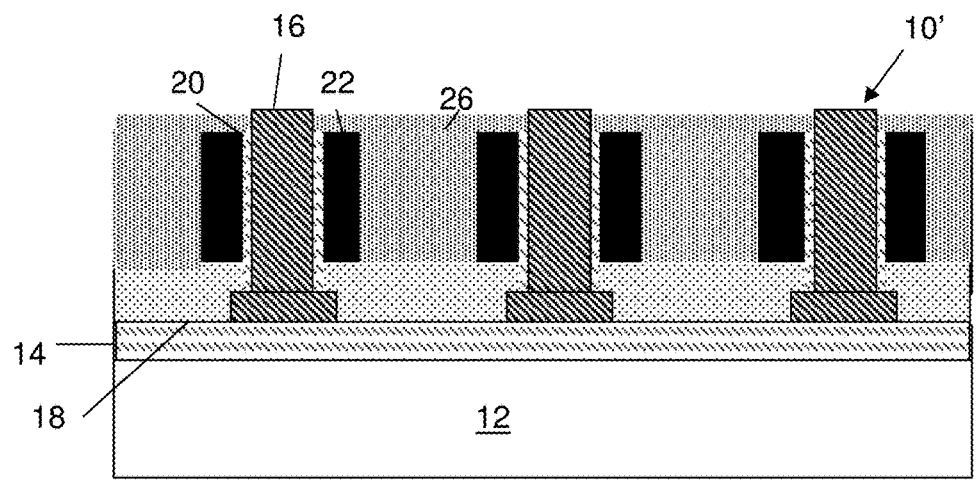
FIG. 5 shows a structure and respective fabrication processes of forming dielectric material about vertical gate structures according to aspects of the invention.

As shown in FIG. 5, a dielectric material 26 is formed within the space between the adjacent structures 10', and on any exposed vertical extent of the narrow portion 16b of the fin 16, resulted from the etch back process of the gate dielectric material 20 and the gate material 22. The dielectric material 26 can be an oxide material, acting as isolation structures between the adjacent structures 10', as well as separating a later formed source or drain region from the gate structure, e.g., the gate dielectric material 20 and the gate material 22. The dielectric material 26 can be formed by a conventional deposition process (e.g., CVD), followed by a planarization process. In embodiments, the planarization process will expose top surfaces of the fins 16, e.g., semiconductor material.

Figure 6:
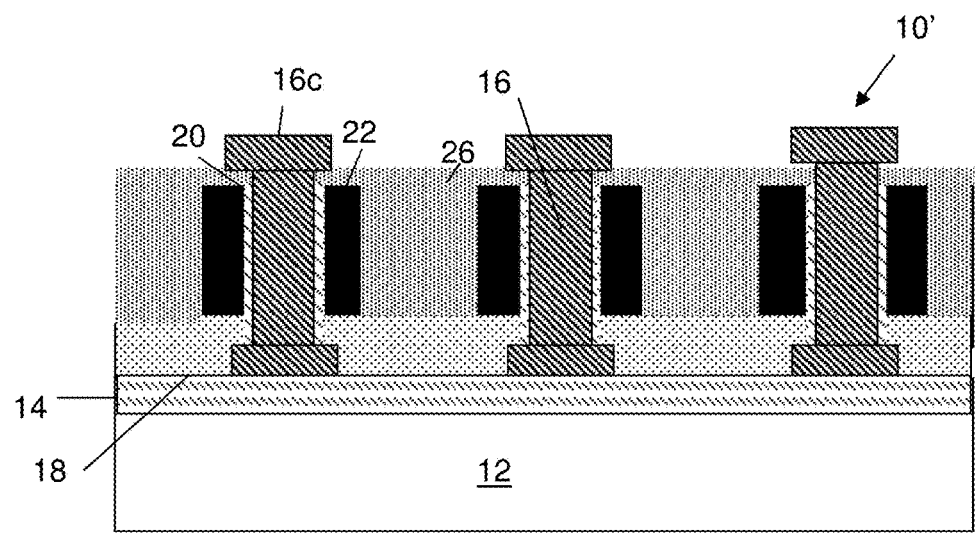
FIG. 6 shows a structure and respective fabrication processes of forming epitaxial material on exposed portions of fins according to aspects of the invention.

In FIG. 6, a wide (thick) portion of semiconductor material 16c is formed on the fin 16 by an epitaxial growth process. As should be understood by those of skill in the art, the wide portion 16c can be used as a source or drain region of the structure 10'; whereas, the wide portion 16a can be used as a drain or source region of the structure 10', respectively. The dielectric material 20 and the gate material 22 will wrap around the vertical sidewalls of the fins 16, between the wider portions 16a, 16c.

Figure 7:
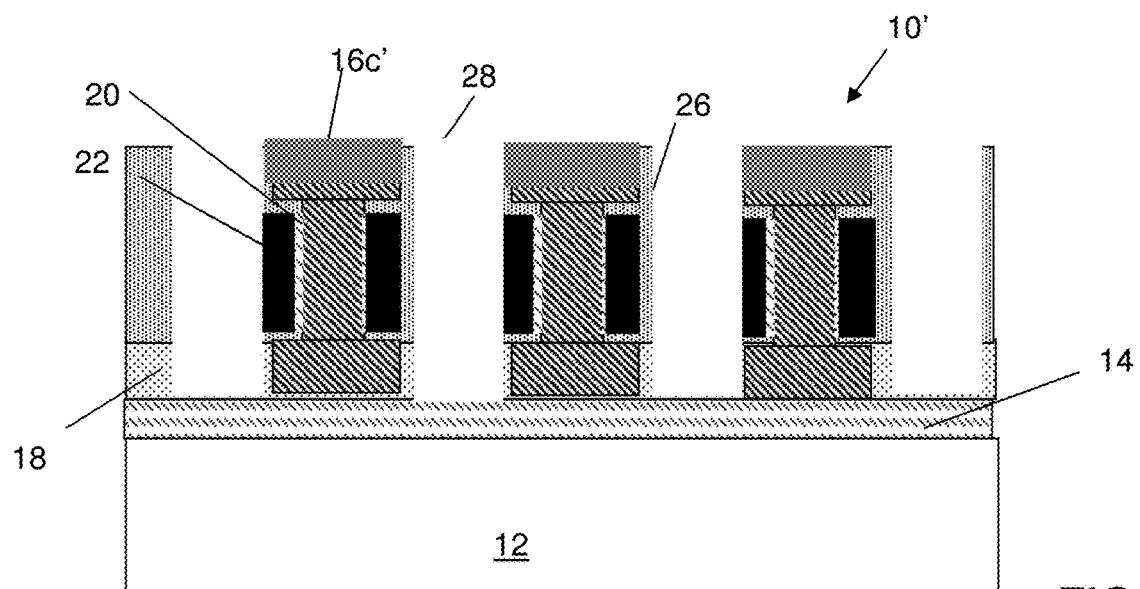
FIG. 7 shows a structure and respective fabrication processes of forming of silicide regions according to aspects of the invention.
Figure 8:
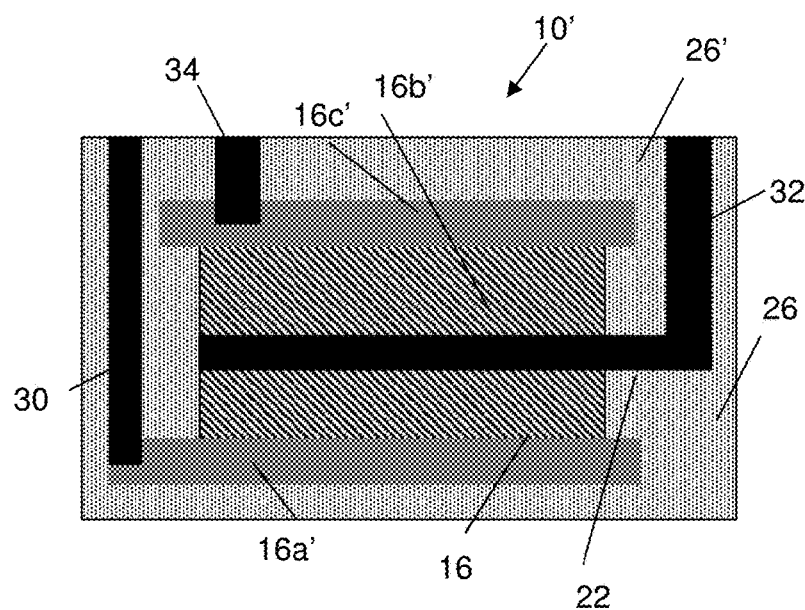
FIG. 8 shows a structure and respective fabrication processes of forming contact regions according to aspects of the invention.

Referring now to FIGS. 7 and 8, contact openings 28 are formed in the dielectric material 26, in order to form silicide regions 16a' and 16c' on the source and drain contact regions of the gate structure 10'. In embodiments, the openings 28 are formed by conventional lithography and etching processes, e.g., reactive ion etching (RIE) processes. The silicide regions 16a' and 16c' can be formed by a platinum silicide process; although cobalt and nickel silicide processes are also contemplated by the present invention.

As should be understood by those of skill in the art, the silicide process begins with deposition of a thin transition metal layer, e.g., platinum, cobalt or nickel, over fully formed and patterned semiconductor devices (e.g., doped or ion implanted source and drain regions formed from the wide portions 16a, 16c as should be understood by those of skill in the art). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts 16a' and 16c' in the active regions of the device.

FIG. 8 shows a cross-sectional view of a single device 10'. In FIG. 8, the drain contact 30, the gate contact 32 and the source contact 34 are formed through the openings. The contacts 30, 32, 34 are formed by a metal deposition process, in direct electrical contact with the respective silicide regions 16a' and 16c' and on metal gate material deposited on the gate structure. The contacts 30, 32, 34 can be formed by a metal deposition process, with liner material. For example, the contacts can be tungsten or copper or alloys thereof, with the liner material being TiN or TaN; although other materials are also contemplated by the present invention.

In embodiments, the metal material can be formed by a conventional deposition process, e.g., CVD, followed by a planarization process to remove any excessive material from the surface of the dielectric material 26. Following the metal fill process to form the contacts 30, 32, 34, additional dielectric material 26' is formed on the structure, e.g., over the devices 10', followed by a planarization process to expose portions of the contacts 30, 32, 34 for middle of the line (MOL) and back end of the line (BEOL) processes. In embodiments, the dielectric material 26, 26' can be an oxide material or ultra low-k dielectric material, as examples. As should now be understood by those of skill in the art, by implementing the processes of the present invention, e.g., moving the contact to the ends of the structures, the resultant pitch of adjacent devices 10' can now be scaled significantly, e.g., 6 nm or less.

Figures 9A, 9B:
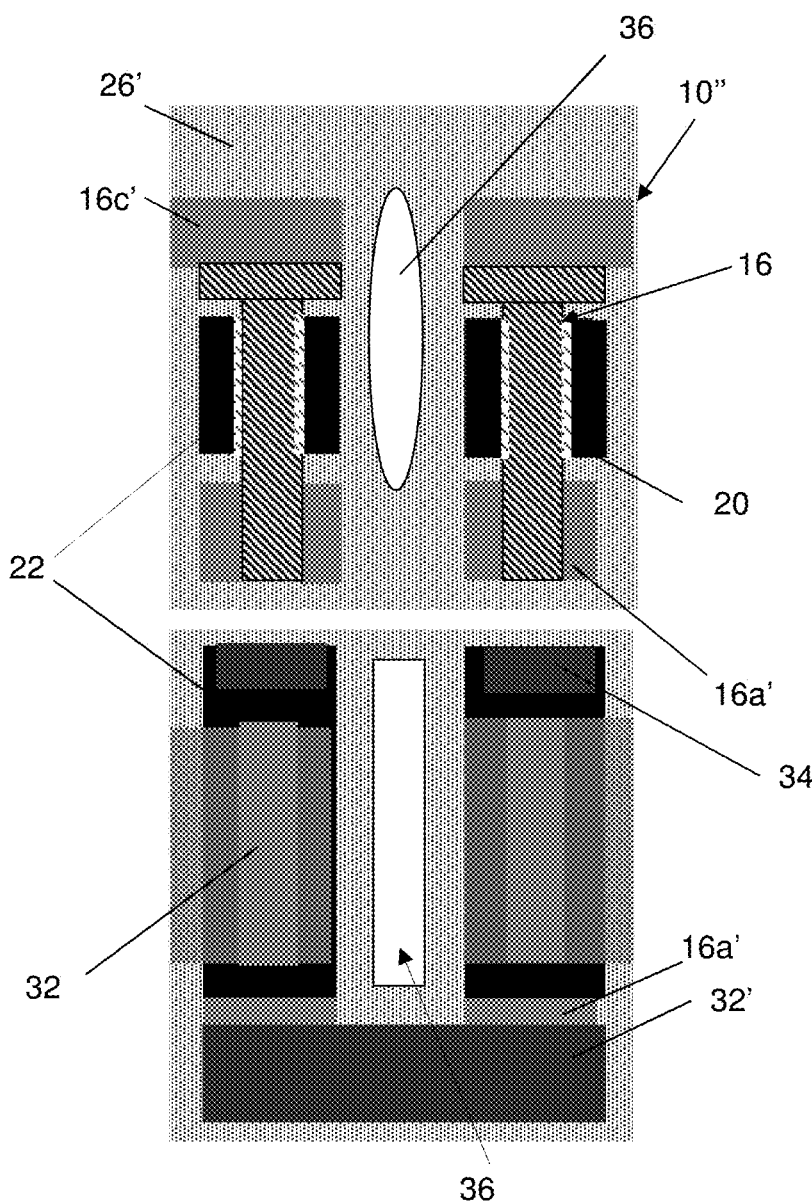
FIGS. 9a and 9b show cross-sectional and top-down views of an alternative structure and respective fabrication processes according to aspects of the invention.

FIGS. 9a and 9b show a cross-sectional view and a top down view of an alternative structure 10'', after formation of the additional dielectric material 26'. In embodiments, the deposition of the additional dielectric material 26' will form an air gap 36 between adjacent devices 10'', effectively reducing the contact resistance. (This air gap 36 can also be formed with the process flow of FIG. 8.) The formation of the air gap 36 is due to a pinching effect of the deposition process, between the minimum pitch, e.g., spacing, of the adjacent devices 10''.

In addition, the devices 10'' shown in FIGS. 9a and 9b include a shared contact strap 32' formed at the drain regions of the devices (FETs) 10''. It should be understood by those of skill in the art that the shared contact strap 32' can equally be formed at the source regions, e.g., other end of the device 10'', or both the source and drain regions as schematically represented by FIGS. 9a and 9b. Thus, the present invention contemplates shared or individual S/D silicide and contact regions. Also, in each of the embodiments described herein, the channel current is in a vertical direction, as these devices are vertical FETs.

Figures 10A, 10B:
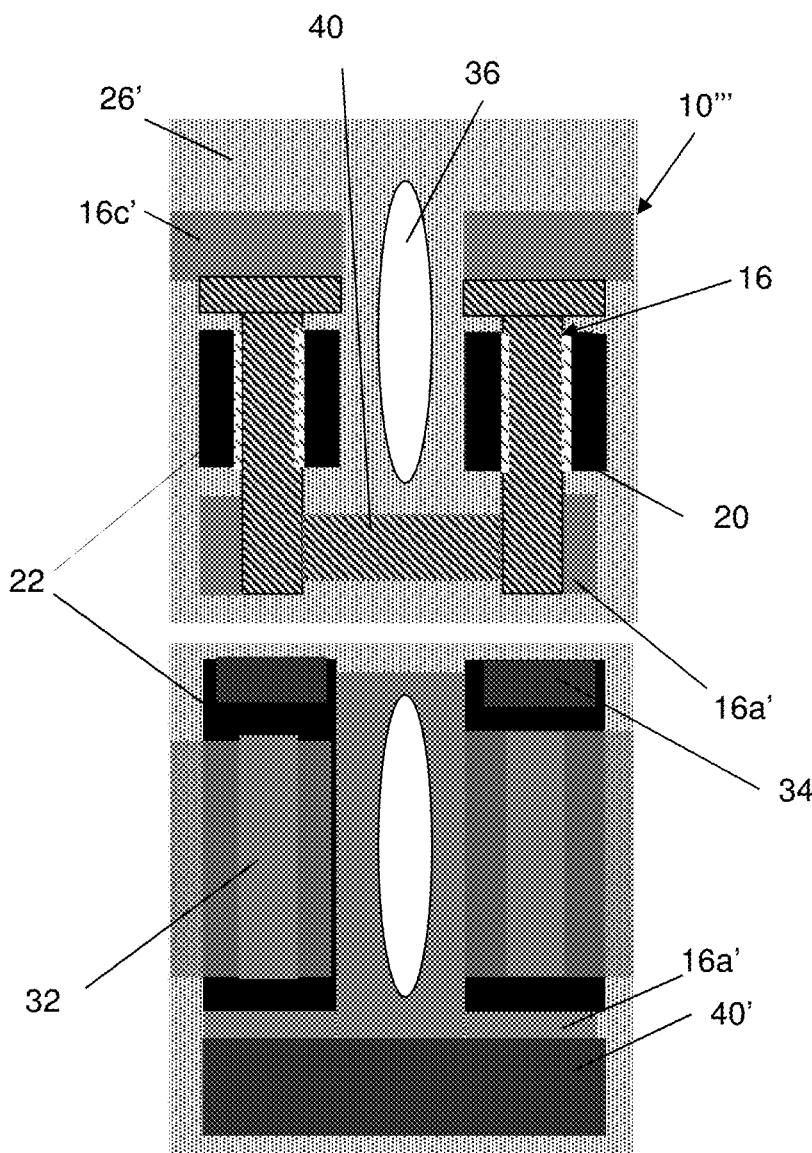
FIGS. 10a and 10b show cross-sectional and top-down views of another alternative structure and respective fabrication processes according to aspects of the invention.

FIGS. 10a and 10b show a cross-sectional view and a top down view of alternative devices 10''' and respective processing steps in accordance with aspects of the present invention. These alternative devices 10''' include merged regions 40, e.g., bottom merged drain region, or alternatively a merged source region or both a source region and a drain region. As should be understood, these merged devices 10''' provide even lower resistance between adjacent FETs; compared to a non-merged FET. The merged devices 10''' can be formed using the processes described herein, with the merged regions 40 being formed together during the formation of the fins structures (and subsequent ion implantation or doping of the source/drain regions), instead of separately for separate devices. A contact 40' also spans across the merged region 40. The contact 40' is formed by conventional lithography, etching and deposition processes as already described herein including the silicide and contact formation. In embodiments, an air gap 36 can optionally be formed between the devices 10''', as already described herein.

Figures 11A, 11B:
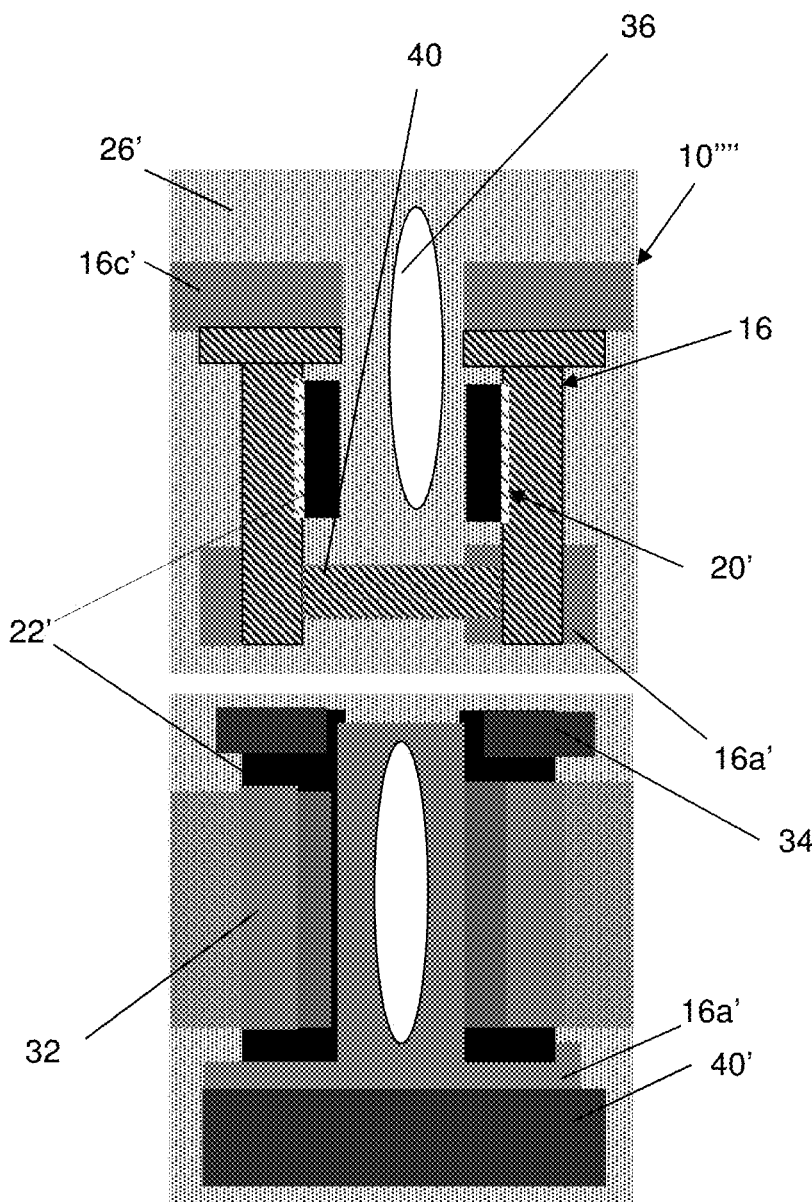
FIGS. 11a and 11b show cross-sectional and top-down views of another alternative structure and respective fabrication processes according to aspects of the invention.

FIGS. 11a and 11b show a cross-sectional view and a top down view of alternative devices 10'''' and respective processing steps in accordance with aspects of the present invention. These alternative devices 10'''' are single sided gates, as shown representatively by the metal material 22' and dielectric material 20' provided on only a single side of the fin structures 16. These devices 10'''' also include an optional merged drain region 40 and contact 40', resulting in lower resistance and higher capacitance. In embodiments, the drain region 40 and contact 40' of the devices 10'''' can be representative of a merged source region, or both a source and a drain region. In embodiments, an air gap 36 can optionally be formed between the devices 10'''', as already described herein.

Figure 12:
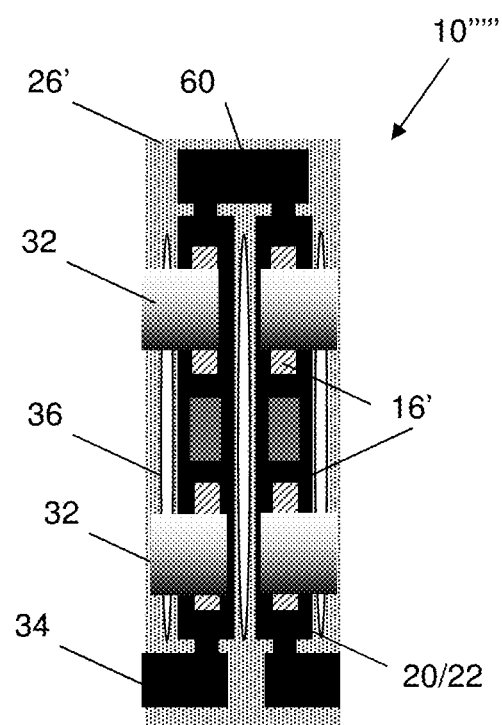
FIG. 12 shows another alternative structure and respective fabrication processes according to aspects of the invention.

FIG. 12 shows another alterative structure and respective processing steps. In this alternative structure, the devices 10''''' include gate material 22 and dielectric material 20 wrapping around two fin structures 16' (in parallel). In embodiments, the gate material 22 and dielectric material 20 can be deposited and patterned in the same processing steps to form the gate structures spanning over the two fin structures 16'. Also, an air gap 36 can optionally be formed between adjacent devices 10''''', extending along the two fin structures 16', as already described herein.

Moreover, the devices 10''''' include a merged bottom drain region 60, or alternatively a source region or both a source region and a drain region, thereby resulting in lower resistance and higher capacitance. The alternative devices 10''''' also can include a shared contact strap as shown by reference numeral 60, formed using the processes described herein and as should understood by those of ordinary skill in the art such that no further explanation is needed for an understanding of the present invention.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A semiconductor structure, comprising:
   two vertical fin structures of semiconductor material; and
   a conductive strap at drain regions of the two vertical fin structures such that the two vertical fin structures have a shared drain silicide.

2. The structure of claim 1, further comprising individual silicides at source regions of the two vertical fin structures.

3. The structure of claim 1, further comprising another conductive strap at source regions of the two vertical fin structures such that the two vertical fin structures have a shared source silicide.

4. The structure of claim 1, further comprising an air gap in a dielectric material between the two vertical fin structures.

5. The structure of claim 1, further comprising gate material contacting with the two vertical fin structures.

6. The structure of claim 5, wherein:
   the gate material includes a gate dielectric material and a metal material on the two vertical fin structures, with a space between the two vertical fin structures.

7. The structure of claim 5, wherein the gate material is entirely around a vertical extent of the two vertical fin structures.

8. The structure of claim 5, wherein the gate material is on a single side of a vertical extent of the two vertical fin structures.

9. The structure of claim 1, wherein the two vertical fin structures are included in two vertical field effect transistors (FETs).

10. The structure of claim 9, wherein a channel current in each of the two vertical FETs is in a vertical direction.

* * * * *